US007436875B2

(12) United States Patent
Miura

(10) Patent No.: US 7,436,875 B2
(45) Date of Patent: Oct. 14, 2008

(54) LASER MODULE HAVING CONTROLLED OPTICAL POWER DENSITY AT EXPOSED SURFACES

(75) Inventor: Hideo Miura, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 50 days.

(21) Appl. No.: 11/489,545

(22) Filed: Jul. 20, 2006

(65) Prior Publication Data

US 2007/0019694 A1 Jan. 25, 2007

(30) Foreign Application Priority Data

Jul. 20, 2005 (JP) ............................ 2005-209656

(51) Int. Cl.
*H01S 3/08* (2006.01)
*G02B 6/26* (2006.01)

(52) U.S. Cl. ........................................ 372/101; 385/38

(58) Field of Classification Search ................. 359/291, 359/245, 248, 290, 292, 295, 298, 220, 222, 359/223, 224, 320, 322; 385/2, 33, 88, 93, 385/38; 372/6, 26, 27, 28, 31, 32, 101, 108, 372/34, 36, 64

See application file for complete search history.

(56) References Cited

U.S. PATENT DOCUMENTS 7,154,584 B2 * 12/2006 Okazaki ...................... 355/53
7,245,804 B2 * 7/2007 Teramura et al. .............. 385/38

FOREIGN PATENT DOCUMENTS

JP 11-054852 A 2/1999
JP 2004-252425 A 9/2004
JP 2004-253783 A 9/2004

* cited by examiner

*Primary Examiner*—Ricky Mack
*Assistant Examiner*—Tuyen Q Tra
(74) *Attorney, Agent, or Firm*—Sughrue Mion, PLLC

(57) ABSTRACT

A laser module includes: one or more semiconductor laser elements which emit one or more laser beams; an optical fiber which has a light-entrance end face; and an optical condensing system which is constituted by one or more optical components and makes the one or more laser beams converge at the light-entrance end face of the optical fiber. In the laser module, at least one of one or more light-entrance surfaces and one or more light-output surfaces of the one or more optical components is exposed to air, and the one or more laser beams realize an optical power density of 15 W/mm$^2$ or lower, or 60 to 800 W/mm$^2$ at the at least one of the one or more light-entrance surfaces and the one or more light-output surfaces.

3 Claims, 4 Drawing Sheets

LASER MODULE HAVING CONTROLLED OPTICAL POWER DENSITY AT EXPOSED SURFACES

BACKGROUND OF THE INVENTION

1. Field of the Invention

The present invention relates to a laser module which is constituted by one or more semiconductor laser elements emitting one or more laser beams, an optical fiber, and an optical injection system making the one or more laser beams converge at an end face of the optical fiber.

2. Description of the Related Art

Conventionally, the laser modules having the following construction are known as the pigtail-type laser modules in the field of optical communications. The pigtail-type laser modules are constituted by a semiconductor laser element being contained in a package and emitting a laser beam, an optical fiber being fixed to the package and having an end (light-entrance end) which appears inside the package, and an optical condensing system making the laser beam converge a light-entrance end face of the optical fiber.

In the case where the output power of a pigtail-type laser module is high, contaminants deposit on surfaces of optical components at which the optical power density is high, so that troubles such as lowering of the transmittance or breakage of the optical components can occur. In particular, low-molecular-weight siloxane being emitted from silicon-based material and suspending in air causes photochemical reaction with oxygen, so that $SiO_2$ is produced and fixed to surfaces of glass components as if evaporation is performed on the surfaces, as indicated in Japanese Unexamined Patent Publication No. 11(1999)-054852 (hereinafter referred to as JPP 11(1999)-054852).

When the transmittance is lowered by the deposition of contaminants on an optical component, the output power of the laser module decreases. Therefore, the optical component in the laser module deteriorates faster than the semiconductor laser (which is the light source in the laser module), so that it is difficult to achieve long-term reliability.

Japanese Unexamined Patent Publication No. 2004-252425 (hereinafter referred to as JPP 2004-252425) and Japanese Unexamined Patent Publication No. 2004-253783 (hereinafter referred to as JPP 2004-253783) disclose techniques for preventing deposition of contaminants on an end face of an optical component. According to the technique disclosed in JPP 2004-252425, a light-entrance end face of an optical fiber is held in close contact with an outer surface of a glass window of a package. In addition, according to the technique disclosed in JPP 2004-253783, a light-entrance end face of an optical fiber is protected by hermetically sealing the light-entrance end face or holding a transparent member (such as a glass block) in close contact with the light-entrance end face.

However, the techniques disclosed in the above patent publications have the following problems.

JPP 2004-252425 discloses a structure wherein a receptacle capable of receiving a ferrule is fixed outside a hermetically sealed package containing semiconductor lasers and lenses, and an optical fiber the tip of which is inserted into the ferrule is connected to the receptacle by using a connector which can fit into the receptacle. However, since the semiconductor lasers and the lenses are contained in the hermetically sealed package, the size of the package increases. Generally, the hermetically sealed package is expensive, and the cost of the hermetically sealed package further increases when the hermetically sealed package is large. In addition, in the above structure, the ferrule is held in contact with the light-output window of the hermetically sealed package. Therefore, it is necessary that the glass window have a hermetically sealing function. Further, since the glass window is pressed when the ferrule is kept in contact with the glass window, it is necessary to increase the strength of the glass window and the sealing portion of the package in order to maintain the hermetically sealing function against the pressure. However, provision for increasing the strength of the glass window and the sealing portion further increases the total cost.

On the other hand, as mentioned before, JPP 2004-253783 discloses a structure for preventing deposition of contaminants on the light-entrance end face of the optical fiber by fixing a transparent member to the light-entrance end face or holding the transparent member in close contact with the light-entrance end face. Specifically, the transparent member is fixed to a chassis, a support, or the tip of the optical fiber. Therefore, it is difficult to replace the transparent member.

SUMMARY OF THE INVENTION

The present invention has been developed in view of the above circumstances.

The object of the present invention is to provide a laser module which exhibits long-term reliability, and can be produced at low cost.

In order to accomplish the above object, the present invention is provided. According to the present invention, there is provided a laser module comprising: one or more semiconductor laser elements which emit one or more laser beams; an optical fiber which has a light-entrance end face; and an optical condensing system which is constituted by one or more optical components and makes the one or more laser beams converge at the light-entrance end face of the optical fiber. In the laser module, the one or more optical components have one or more light-entrance surfaces through which the one or more laser beams are inputted into the one or more optical components and one or more light-output surfaces through which the one or more laser beams are outputted from the one or more optical components, at least one of the one or more light-entrance surfaces and the one or more light-output surfaces is exposed to air, and the one or more laser beams realize an optical power density of 15 $W/mm^2$ or lower, or 60 to 800 $W/mm^2$ at the at least one of the one or more light-entrance surfaces and the one or more light-output surfaces.

According to the present invention, the lifetime of the at least one of the one or more light-entrance surfaces and the one or more light-output surfaces exposed to air becomes approximately 5,000 hours, which is equivalent to the lifetimes of the semiconductor laser elements. Therefore, it is possible to achieve long-term reliability at low cost since the expensive sealed package is not used.

Preferably, the laser module according to the present invention may also have one or any possible combination of the following additional features (i) to (iii).

(i) The one or more laser beams may realize the optical power density of 10 $W/mm^2$ or lower, or 70 to 600 $W/mm^2$ at the at least one of the one or more light-entrance surfaces and the one or more light-output surfaces. In this case, the lifetime of the at least one of the one or more light-entrance surfaces and the one or more light-output surfaces exposed to air becomes approximately 10,000 hours, as explained later. Therefore, even in the case where the one or more semiconductor laser elements have longer lifetimes than the normal semiconductor lasers, the entire lifetime of the laser module is not reduced by deterioration of the at least one of the one or more light-entrance surfaces and the one or more light-output surfaces, so that the laser module according to the present invention exhibits long-term reliability.

(ii) The one or more semiconductor laser elements may have an oscillation wavelength of 500 nm or less. In this case, the present invention is particularly effective. For example, the one or more semiconductor laser elements may be GaN-based semiconductor laser elements, which have the oscillation wavelengths of 350 to 500 nm. As explained later with reference to FIG. 2, when the wavelengths of the one or more laser beams emitted from the one or more semiconductor laser elements is 500 nm or less, deposition of contaminants on optical components at which the optical power density is high is promoted, and therefore the laser module according to the present invention, in which deposition of contaminants is suppressed, is particularly effective.

(iii) The one or more semiconductor laser elements may be a single-transverse-mode semiconductor laser element, a transverse-mode broad-area semiconductor laser element, an array of single-transverse-mode semiconductor laser elements, an array of transverse-mode broad-area semiconductor laser elements, or a mixed array of at least one single-transverse-mode single semiconductor laser element and at least one transverse-mode broad-area semiconductor laser element.

DESCRIPTION OF PREFERRED EMBODIMENTS

Figure 1:
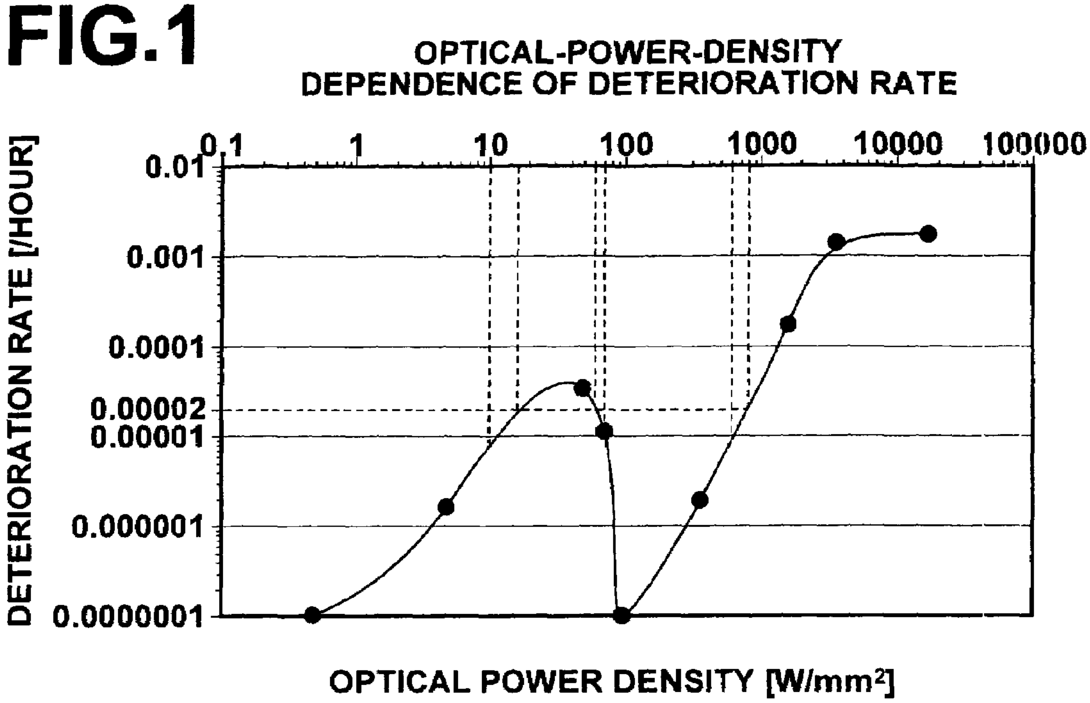
FIG. 1 is a graph indicating the optical-power-density dependence of the deterioration rate of an optical component.

Preferred embodiments of the present invention are explained in detail below with reference to drawings. In the drawings, equivalent elements and constituents are indicated by the same reference numbers even in drawings for different embodiments, and descriptions of the equivalent elements or constituents are not repeated in the following explanations unless necessary.

Deterioration Characteristic of Optical Component

The present inventor has investigated relationships between the optical power density at a light-entrance surface or a light-output surface of an optical component and deposition of contaminants on the light-entrance surface or the light-output surface. FIG. 1 is a graph indicating a relationship between the deterioration rate of an optical component and the optical power density at a light-entrance end face of the optical component. The relationship of FIG. 1 is obtained on the basis of measurement of the deterioration rate at various values of the optical power density. In the measurement, the optical component is placed in an optical path of a laser beam having the wavelength of 405 nm. The deterioration rate is defined as the variation in the transmittance of the optical component with time, and obtained as the gradient of a curve plotted on the basis of the values of the transmittance of the optical component measured during aging for approximately 1,000 hours. Specifically, the measurement is performed in an arrangement in which a laser beam emitted from a semiconductor laser driven with electric power of 50 to 100 mW is condensed with a lens so as to realize a desired optical power density, and a glass member as the optical component is placed at the condensing point of the laser beam. The measurement at the maximum optical power density is realized in the arrangement in which the glass member is placed close to the light-emission end face of the semiconductor laser. On the other hand, the optical power density is adjusted to lower values by inserting a filter in the optical path on the backward side of the condensing point.

Figure 2:
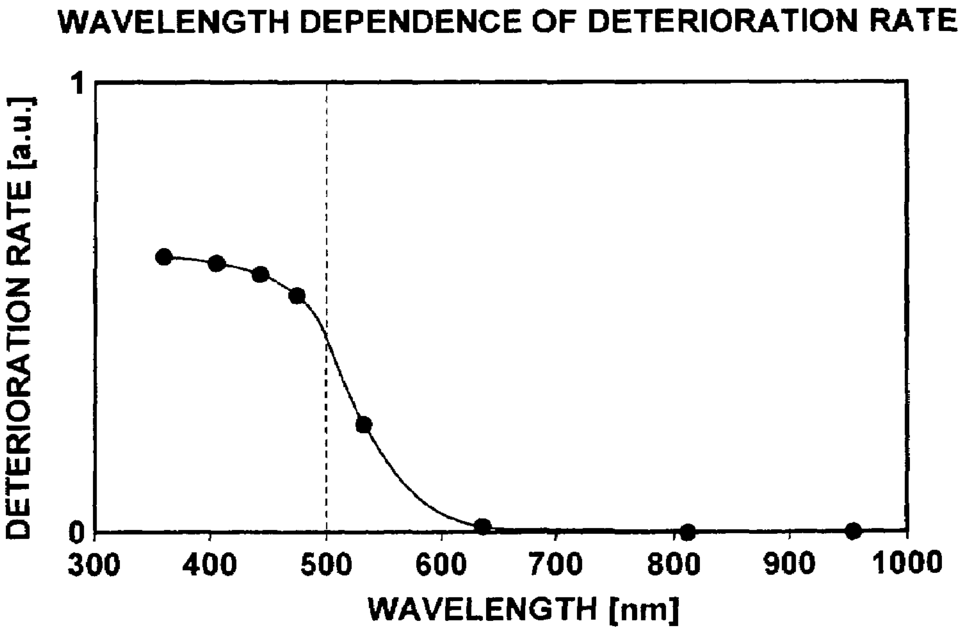
FIG. 2 is a graph indicating the wavelength dependence of the deterioration rate of an optical component.

The present inventor has also investigated the wavelength dependence of the deterioration rate. FIG. 2 is a graph indicating the wavelength dependence of the deterioration rate. The relationship of FIG. 2 is obtained on the basis of measurement of the deterioration rate at the wavelengths of 360 nm, 405 nm, 441 nm, 473 nm, 532 nm, 633 nm, 809 nm, and 950 nm. The measurement is performed in an arrangement in which an optical component is placed in the optical path of the laser beam. Although the optical power density at a light-entrance surface of the optical component is different in the measurement at each wavelength, the deterioration rate at the optical power density of 10,000 W/mm$^2$ is estimated on the basis of the measured value of the deterioration rate at each wavelength. In FIG. 2, the values of the deterioration rate are normalized to a predetermined value.

As indicated in FIG. 1, in the range of the optical power density lower than 100 W/mm$^2$, the deterioration rate gradually increases with the optical power density until the deterioration rate reaches a local maximum, and the deterioration rate decreases with increase in the optical power density from the value corresponding to the local maximum until the deterioration rate reaches a local minimum at the optical power density near 100 W/mm$^2$. The deterioration rate again increases with increase in the optical power density from the value corresponding to the local minimum. Further, the present inventor has confirmed a similar optical-power-density dependence of the deterioration rate at the wavelength of 473 nm as well as 405 nm. As indicated in JPP 11(1999)-054852, it is considered that deposition of silicon compounds increases the deterioration rate in the range of high optical power density exceeding 1,000 W/mm$^2$. On the other hand, material deposited in the range of lower optical power density near 30 W/mm$^2$ (at which the optical power density is locally maximized) is not clear. However, the present inventor has found that as indicated in FIG. 1, the deterioration rate of the optical component varies (i.e., the transmittance of the optical component decreases) with the optical power density, and the deterioration of the optical component (the decrease in the transmittance of the optical component) is sufficiently slow in predetermined ranges of the optical power density in comparison with the deterioration of the semiconductor lasers, so that the deterioration of the optical component does not affect the entire lifetime of the laser module in the predetermined ranges of the optical power density. For example, when the lifetime of the optical component is defined as the time which elapses until the transmittance of the optical component decreases by 10%, and it is assumed that the curve of the variation in the transmittance of the optical component with time is approximated by a straight line, the lifetime of the optical component having the deterioration rate of 0.00002/hour becomes 5,000 hours. On the other hand, the lifetimes of the semiconductor lasers are approximately 5,000 hours.

Therefore, it is considered that when the deterioration rate of the optical component is 0.00002/hour, the lifetime of the optical component does not affect the entire lifetime of the laser module. FIG. 1 shows that the deterioration rate of the optical component is 0.00002/hour or lower when the optical power density is 15 W/mm$^2$ or lower, or 60 to 800 W/mm$^2$, and 0.00001/hour or lower when the optical power density is 10 W/mm$^2$ or lower, or 70 to 600 W/mm$^2$.

In addition, as indicated in FIG. 2, the deterioration rate begins to increase when the laser wavelength decreases to approximately 600 nm, and is significantly great in the short wavelength range of 500 nm or shorter.

In consideration of the above investigation results, the aforementioned ranges of the optical power density (15 W/mm$^2$ or lower, or 60 to 800 W/mm$^2$) in the laser module according to the present invention and the aforementioned, preferable ranges of the optical power density (10 W/mm$^2$ or lower, or 70 to 600 W/mm$^2$) and the laser wavelength (500 nm or shorter) are determined.

First Embodiment

Figure 3:
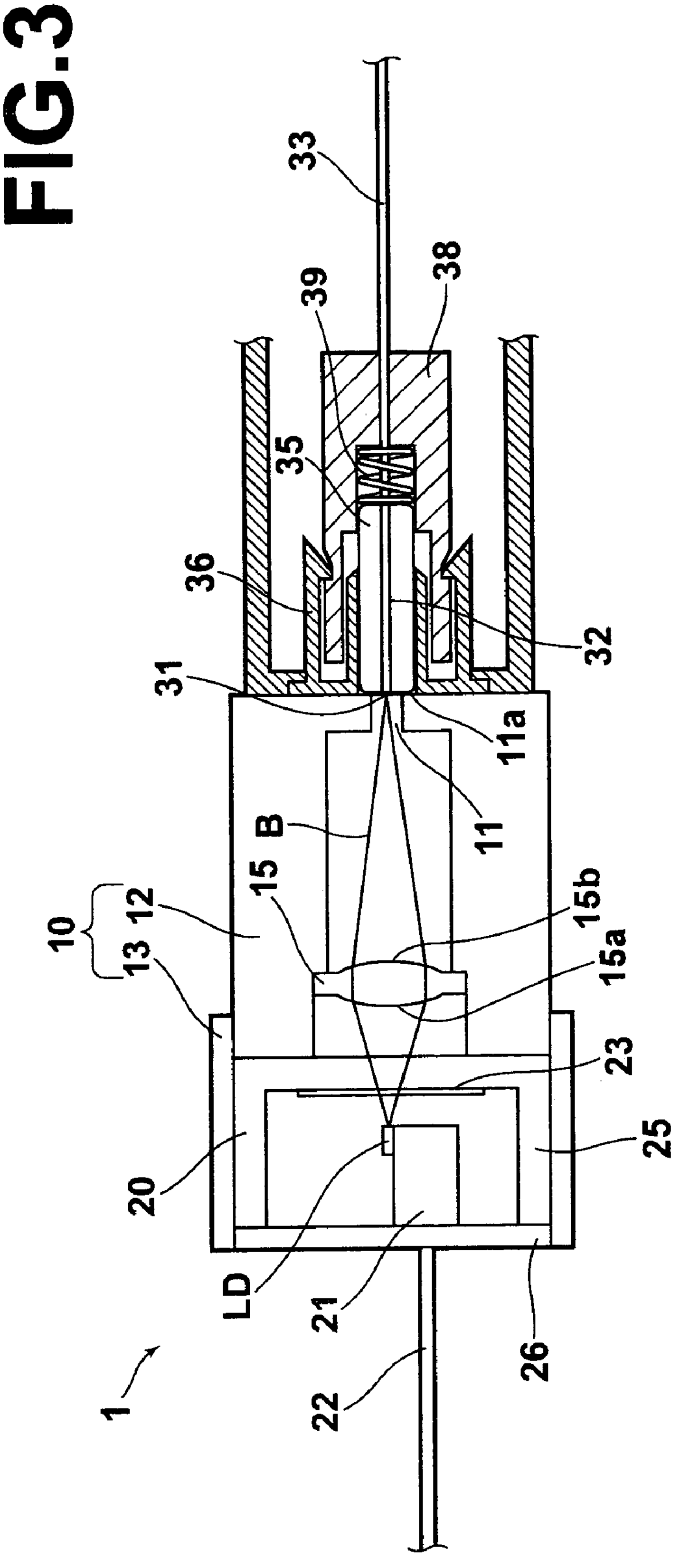
FIG. 3 is a side view, partly in cross section, of a laser module according to a first embodiment of the present invention.

The first embodiment of the present invention is explained below. FIG. 3 is a side view, partly in cross section, of a laser module according to the first embodiment of the present invention. In addition, FIG. 4 is a side view, partly in cross section, of the laser module according to the first embodiment, where a connector is detached.

Figure 4:
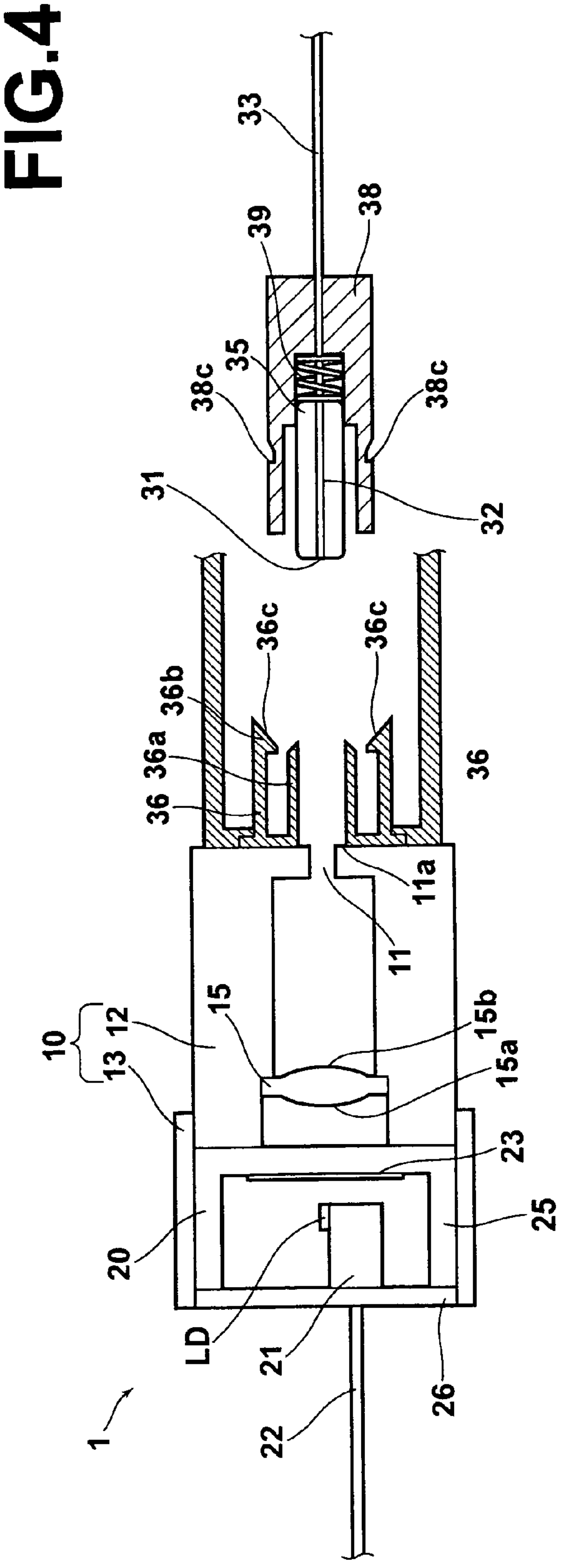
FIG. 4 is a side view, partly in cross section, of the laser module according to the first embodiment, where a connector is detached.

As illustrated in FIGS. 3 and 4, the laser module 1 according to the first embodiment comprises a chassis 10, a CAN package 20, a condensing lens 15, and an optical fiber 33. The chassis 10 is constituted by a first lens-barrel 12 and a second lens-barrel 13. The first lens-barrel 12 has a light-output window 11, and is fitted into and fixed to the second lens-barrel 13. A semiconductor laser element LD is mounted in the CAN package 20. The CAN package 20 is hermetically sealed, press fitted into the second lens-barrel 13 from one end of the second lens-barrel 13, and fixed to the second lens-barrel 13. The condensing lens 15 is held within the first lens-barrel 12. The optical fiber 33 has a light-entrance end face 31 from which a laser beam B emitted from the semiconductor laser element LD enters the optical fiber 33, and a near-tip portion 32 of the optical fiber 33 including the light-entrance end face 31 is inserted into a ferrule 35. Although the CAN package 20 containing the semiconductor laser element LD is hermetically sealed, the chassis 10 constituted by the first lens-barrel 12 and the second lens-barrel 13 is not hermetically sealed, so that the condensing lens 15 (arranged in the chassis 10) and the light-entrance end face 31 of the optical fiber 33 are exposed to air.

The semiconductor laser element LD is arranged on a block 21 fixed in the CAN package 20. In addition, wirings 22 for supplying driving current to the semiconductor laser element LD are led out through an opening to the outside of the CAN package 20, where the opening is formed in a first wall of the CAN package 20. Further, a light-output window 23 is formed in a second wall of the CAN package 20, which is arranged opposite to the first wall.

The chassis 10 has an opening 11 having a diameter smaller than the ferrule 35, and a receptacle 36 which is arranged to receive the ferrule 35 is attached to the chassis 10 so as to surround the opening 11. A connector 38 is fitted on the near-tip portion 32 of the optical fiber 33 which is inserted in the ferrule 35, where the connector 38 is so formed that the connector 38 can be fitted into the receptacle 36. The receptacle 36 has an inner sleeve 36*a* and an outer sleeve 36*b*. The ferrule 35 is received by the inner sleeve 36*a* in the receptacle 36. The outer sleeve 36*b* has a means for engagement 36*c*, and the connector 38 also has a means for engagement 38*c*. The means for engagement 36*c* and 38*c* are arranged to engage with each other.

The connector 38 has a spring 39 for pressing the ferrule 35 against the chassis 10 when the connector 38 is fitted into the receptacle 36. Thus, when the connector 38 is connected with the receptacle 36, the ferrule 35 applies a predetermined pressure to the periphery 11*a* of the opening 11 through the spring 39 so that the light-entrance end face 31 of the optical fiber 33 is brought into contact with the chassis 10. As illustrated in FIG. 4, the connector 38 can be detached from and reattached to the receptacle 36.

The laser module 1 according to the first embodiment can be assembled as follows.

First, the semiconductor laser element LD is mounted on the block 21 in the round CAN package 20 with a brazing material of AuSn. Then, a cap 25 having the aforementioned light-output window 23 is fixed to a block-fixing member 26 by resistance welding, and the CAN package 20 is degassed in order to remove volatile materials from the inside of the CAN package 20. After being filled with inert gas, the CAN package 20 is hermetically sealed. The degassing and hermetically sealing of the CAN package 20 suppress deposition of contaminants on the light-emission end face of the semiconductor laser element LD.

Next, the hermetically sealed CAN package 20 is press fitted into the second lens-barrel 13 from one end of the second lens-barrel 13, and fixed to the second lens-barrel 13. At this time, it is possible to fix the CAN package 20 by YAG welding, or by using an adhesive or solder.

The first lens-barrel 12 in which the condensing lens 15 is fixed in advance can be fitted into the second lens-barrel 13 in which the CAN package 20 is fixed in advance by sliding the first lens-barrel 12 in the optical-axis direction. Then, the position of the second lens-barrel 13 with respect to the first lens-barrel 12 is adjusted so that the laser beam B emitted from the semiconductor laser element LD converges at the opening 11, at which the light-entrance end face 31 of the optical fiber 33 is positioned. Thereafter, the first lens-barrel 12 is fixed to the second lens-barrel 13 by YAG welding, or by using an adhesive, solder, or the like. Thus, assembly of the chassis 10 constituted by the first lens-barrel 12 and the second lens-barrel 13 is completed.

The receptacle 36 is fixed on the first lens-barrel 12 (constituting the chassis 10) so that the receptacle 36 surrounds the light-output window 11 and the laser beam B condensed by the condensing lens 15 most efficiently enters the optical fiber 33. Therefore, the condensing point of the laser beam B and the position of the inner sleeve 36*a* in the receptacle 36 do not move. Thus, even when the optical fiber 33 is replaced, the precision in the above positions is maintained, so that it is possible to achieve high coupling efficiency.

In the case where the internal diameter of the inner sleeve 36*a* in the receptacle 36 has the precision of 2 micrometers or less, and the outer diameter of the ferrule 35 has the precision of 1 micrometer or less, it is possible to achieve the precision of 3 micrometers or less in the condensing point of the laser beam B and the position of the light-entrance end face 31 of the optical fiber 33 when the optical fiber 33 is attached.

In addition, the arrangement of the CAN package 20, the condensing lens 15, and the optical fiber 33 is adjusted so that the optical power density at the light-entrance surface 15*a* and the light-output surface 15*b* of the condensing lens 15 and the light-entrance end face 31 of the optical fiber 33 is 15 W/mm$^2$ or lower, or 60 to 800 W/mm$^2$, and preferably 10 W/mm$^2$ or lower, or 70 to 600 W/mm$^2$.

In the laser module 1 according to the present embodiment, the laser beam B emitted from the semiconductor laser element LD is outputted through the light-output window 23 of the CAN package 20, and condensed by the condensing lens 15. Then, the condensed laser beam B passes through the light-output window 11 of the chassis 10, enters the optical fiber 33 through the light-entrance end face 31, propagates through the optical fiber 33, and is outputted from a light-output end face (not shown) of the optical fiber 33.

Further, the CAN package 20 used for hermetically sealing the semiconductor laser element may be a commercially available, inexpensive CAN package. In addition, since the chassis 10 is not required to be hermetically sealed, the chassis 10 can be constructed at low cost. Therefore, the laser module 1 according to the first embodiment can be produced at low cost.

Since the laser module 1 according to the first embodiment operates so that the optical power density at the light-entrance surface 15*a* and the light-output surface 15*b* of the condensing lens 15 and the light-entrance end face 31 of the optical fiber 33 is 15 W/mm$^2$ or lower, or 60 to 800 W/mm$^2$, and preferably 10 W/mm$^2$ or lower, or 70 to 600 W/mm$^2$, deposition of contaminants on the light-entrance surface 15*a* and the light-output surface 15*b* of the condensing lens 15 and the light-entrance end face 31 of the optical fiber 33 is effectively suppressed. Therefore, it is possible to increase the lifetime of the laser module and realize long-term reliability of the laser module.

Second Embodiment

Figure 5:
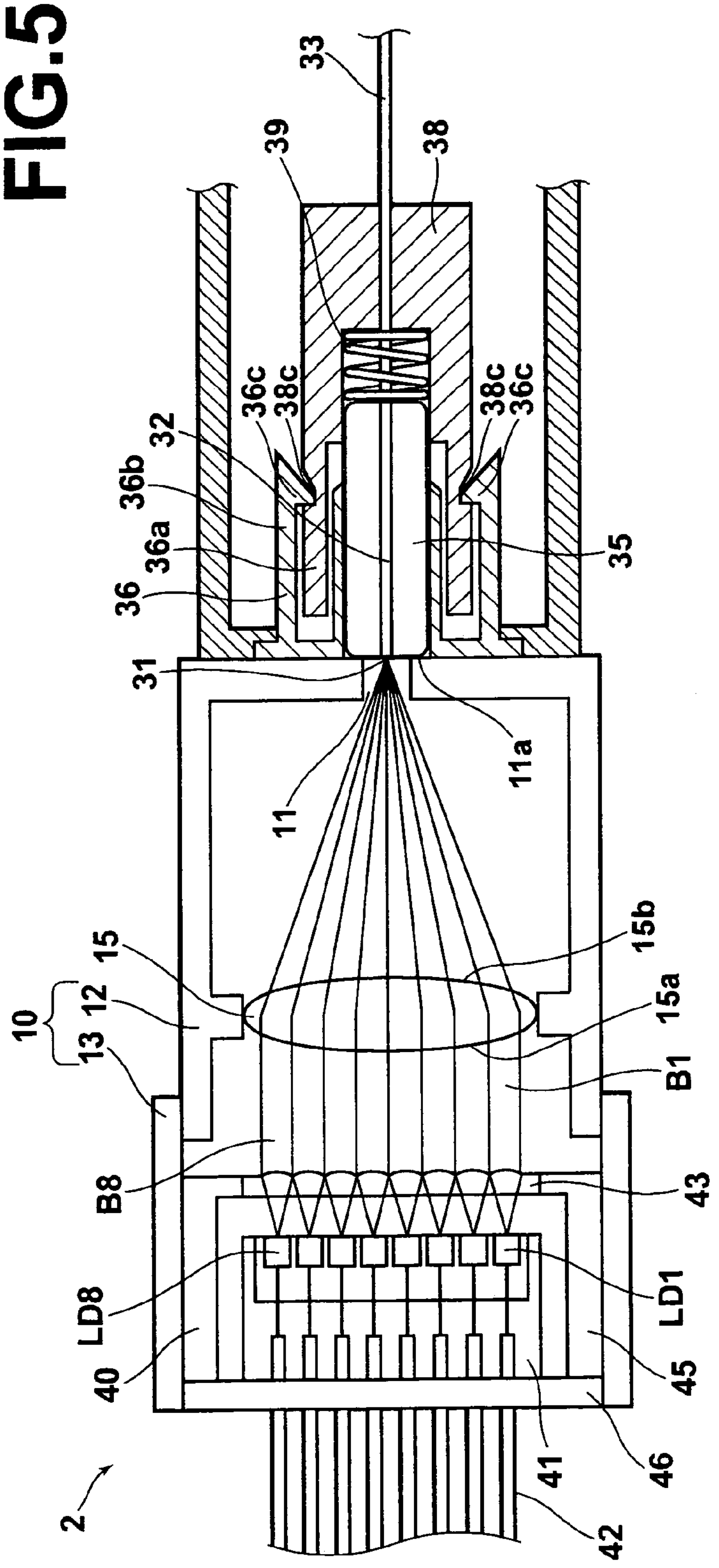
FIG. 5 is a plan view of a laser module according to a second embodiment of the present invention.

The second embodiment of the present invention is explained below. FIG. 5 is a schematic plan view of a laser module according to the second embodiment of the present invention.

As illustrated in FIG. 5, the laser module 2 according to the second embodiment comprises eight GaN-based semiconductor laser elements LD1 to LD8 in the CAN package 40. The semiconductor laser elements LD1 to LD8 emit divergent laser beams B1 to B8. In addition, a light-output window is formed in a first wall of the CAN package 40. Specifically, the light-output window is realized by a collimator-lens array 43. In FIG. 5, the collimator-lens array 43 and the condensing lens 15 are schematically illustrated, and for simple illustration, only the semiconductor laser elements at both ends and the corresponding laser beams bear the references B1, B8, LD1, and LD8.

The semiconductor laser elements LD1 to LD8 are arranged on a block 41 in the CAN package 40, wirings 42 for supplying driving current to the semiconductor laser elements LD1 to LD8 are led out through an opening to the outside of the CAN package 40, where the opening is formed in a second wall of the CAN package 40, which is opposite to the first wall. As in the first embodiment, a cap 45 having the light-output window 43 is fixed to a block-fixing member 46 by resistance welding, and the CAN package 40 is hermetically sealed.

In the laser module 2 according to the second embodiment, the collimator-lens array 43 and the condensing lens 15 constitute an optical condensing system, and the optical condensing system and the optical fiber 33 constitute an optical combining system. That is, the divergent laser beams B1 to B8 emitted from the semiconductor laser elements LD1 to LD8 are collimated by the collimator-lens array 43, and condensed by the condensing lens 15 so as to converge at the light-entrance end face 31 of the optical fiber 33. Then, the condensed laser beams B1 to B8 enter the core of the optical fiber 33, propagate through the optical fiber 33, and are combined into a single laser beam B, which is outputted from a light-output end face (not shown) of the optical fiber 33.

In addition, as in the first embodiment, the arrangement of the CAN package 40, the condensing lens 15, and the optical fiber 33 is adjusted so that the optical power density at the light-entrance surface 15*a* and the light-output surface 15*b* of the condensing lens 15 and the light-entrance end face 31 of the optical fiber 33 is 15 W/mm$^2$ or lower, or 60 to 800 W/mm$^2$, and preferably 10 W/mm$^2$ or lower, or 70 to 600 W/mm$^2$.

Hereinbelow, a concrete example of the laser module according to the second embodiment is indicated.

In the concrete example, the semiconductor laser elements LD1 to LD8 are GaN-based semiconductor lasers having the oscillation wavelength of 405 nm and the output power of 200 mW. Since the number of the semiconductor lasers is eight, the total output power is calculated to be 1.6 W (=200 mW×8). However, since loss occurs in the optical loss, the actual output power of the laser module as the concrete example (the power of the output from the laser-output end face of the optical fiber 33) becomes approximately 1.1 W. In addition, the focal length of the condensing lens 15 is 3 mm, the core diameter of the optical fiber 33 is 60 micrometers, and the distance between the condensing lens 15 and the light-entrance end face 31 of the optical fiber 33 is 45 mm.

In the above laser module, the optical power density at the light-entrance surface 15*a* and the light-output surface 15*b* is 1 W/mm$^2$. In addition, when the optical power of the laser beams at the light-entrance end face 31 is approximately 1.5 W, the optical power density at the light-entrance end face 31 becomes 40 W/mm$^2$.

As indicated above, it is possible to realize the optical power density of 15 W/mm$^2$ or lower, or 60 to 800 W/mm$^2$ at the light-entrance surface 15*a* and the light-output surface 15*b* of the condensing lens 15 and the light-entrance end face 31 of the optical fiber 33 in the laser modules according to the first and second embodiments of the present invention by appropriately determining the focal length of the condensing lens 15 and the core diameter of the optical fiber and appropriately adjusting the arrangement of the condensing lens 15 and the optical fiber 33.

Additional Matters (1) Although the eight semiconductor laser elements LD1 to LD8 used in the second embodiment are single-cavity semiconductor laser elements, alternatively one or more multi-cavity semiconductor laser chips may be used. For example, four double-cavity semiconductor laser elements or a single multi-cavity semiconductor laser chip having eight cavities may be used. Further, the semiconductor laser elements LD1 to LD8 may not be GaN-based semiconductor laser elements.

(2) Each semiconductor laser element used in each embodiment may be a semiconductor laser element which has an emission region with a width smaller than 2 micrometers and outputs a laser beam in a single transverse mode, or a semiconductor laser element which has an emission region with a width equal to or greater than 2 micrometers and outputs a broad laser beam. In the case where a plurality of semiconductor laser elements are mounted, the plurality of semiconductor laser elements may be a mixture of at least one single-transverse-mode semiconductor laser element and at least one broad-area semiconductor laser element.

(3) The one or more semiconductor laser elements used in each embodiment may not be GaN-based semiconductor laser elements. However, since the GaN-based semiconductor laser elements emit high-energy laser beams having the wavelength of 500 nm or less, the optical power density at the light-entrance surface and the light-output surface of the condensing lens and the light-entrance end face of the optical fiber becomes very high, so that contaminants are likely to deposit. Therefore, in a laser module containing one or more semiconductor lasers which emit high-energy laser beams as the GaN-based semiconductor lasers, deposition of contaminants can be effectively suppressed by limiting the optical power density at the light-entrance surface and the light-output surface of the condensing lens and the light-entrance end face of the optical fiber (which are exposed to air) within the ranges according to the present invention.

(4) The optical condensing system in the laser module according to the present invention may further comprise one or more collimator lenses and/or one or more other optical components as well as the condensing lens. Even in the case where one or more surfaces of the one or more collimator lenses and/or one or more other optical components in the laser module are exposed to air, it is also possible to achieve the effect of suppressing deposition of contaminants according to the present invention by holding the optical power density of 15 W/mm$^2$ or lower, or 60 to 800 W/mm$^2$ at the one or more surfaces of the one or more collimator lenses and/or one or more other optical components as well as the light-entrance surface and the light-output surface of the condensing lens and the light-entrance end face of the optical fiber.

What is claimed is:

1. A laser module comprising:

one or more semiconductor laser elements which emit one or more laser beams;

an optical fiber which has a light-entrance end face; and an optical condensing system which is constituted by one or more optical components and makes said one or more laser beams converge at said light-entrance end face of said optical fiber;

wherein said one or more optical components have one or more light-entrance surfaces through which said one or more laser beams are inputted into the one or more optical components and one or more light-output surfaces through which said one or more laser beams are outputted from the one or more optical components, at least one of the one or more light-entrance surfaces and the one or more light-output surfaces is exposed to air, and said one or more laser beams realize an optical power density of 15 W/mm$^2$ or lower, or 60 to 800 W/mm$^2$ at said at least one of the one or more light-entrance surfaces and the one or more light-output surfaces.

2. A laser module according to claim 1, wherein said one or more laser beams realize an optical power density of 10 W/mm$^2$ or lower, or 70 to 600 W/mm$^2$ at said at least one of the one or more light-entrance surfaces and the one or more light-output surfaces.

3. A laser module according to claim 1, wherein said one or more semiconductor laser elements have an oscillation wavelength of 500 nm or less.

* * * * *